United States Patent
Maryschka

(10) Patent No.: US 11,670,557 B2
(45) Date of Patent: Jun. 6, 2023

(54) CIRCUIT ASSEMBLY

(71) Applicant: Continental Automotive GmbH, Hannover (DE)

(72) Inventor: Michael Maryschka, Vienna (AT)

(73) Assignee: Continental Automotive GmbH, Hannover (DE)

( * ) Notice: Subject to any disclaimer, the term of this patent is extended or adjusted under 35 U.S.C. 154(b) by 145 days.

(21) Appl. No.: 17/066,674

(22) Filed: Oct. 9, 2020

(65) Prior Publication Data
US 2021/0111081 A1  Apr. 15, 2021

(30) Foreign Application Priority Data
Oct. 11, 2019  (DE) ..................... 10 2019 215 659.2

(51) Int. Cl.
*H01L 23/10* (2006.01)
*H01L 23/31* (2006.01)

(52) U.S. Cl.
CPC .......... *H01L 23/10* (2013.01); *H01L 23/3121* (2013.01)

(58) Field of Classification Search
CPC ....... H01L 23/02; H01L 23/10; H01L 23/053; H01L 23/3121; H05K 5/03
See application file for complete search history.

(56) References Cited

U.S. PATENT DOCUMENTS 5,230,759 A * 7/1993 Hiraiwa .................. H01L 23/10
                                                    257/710
2014/0233197 A1   8/2014 Schwab et al.

FOREIGN PATENT DOCUMENTS

| DE | 3930377 A1 | 3/1990 |
| DE | 102013002629 A1 | 8/2014 |
| GB | 2366668 A | 3/2002 |

OTHER PUBLICATIONS

Office Action dated May 19, 2020 from corresponding German Patent Application No. DE 10 2019 215 659.2.

* cited by examiner

*Primary Examiner* — Tucker J Wright

(57) ABSTRACT

Disclosed is a circuit assembly, in particular for a motor vehicle. The circuit assembly comprises a circuit board, an electronic component which is arranged on the circuit board and electrically connected to the circuit board via at least one electrical contact point, and a foamed material sealing element which seals off the electronic component and the at least one electrical contact point in media-tight fashion with respect to surroundings.

4 Claims, 3 Drawing Sheets

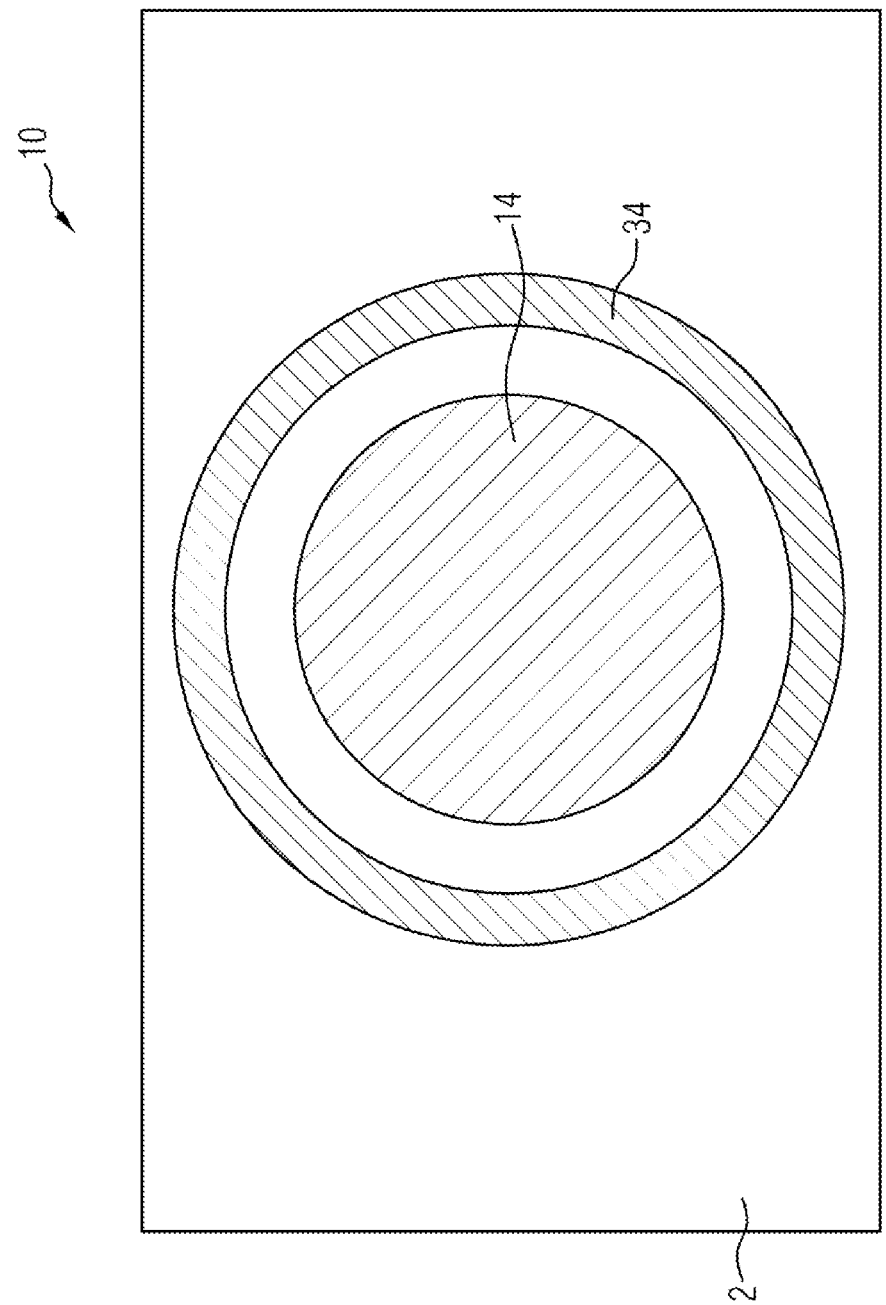

CIRCUIT ASSEMBLY

BRIEF DESCRIPTION OF THE DRAWINGS

Further features and objects of the present disclosure will become apparent to a person skilled in the art by practising the present teaching and taking into consideration the accompanying drawings. In the drawings:

FIG. 3 is a schematic sectional view of the circuit assembly of FIG. 2 along the section line A-A.

Figure 1:
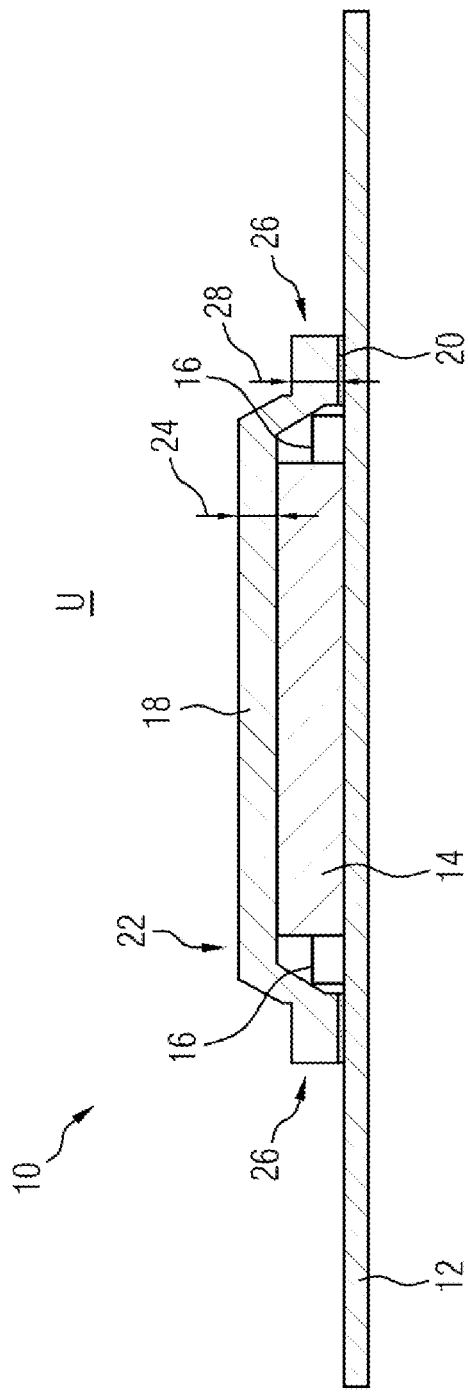
FIG. 1 is a schematic view of an exemplary embodiment of a circuit assembly.

Elements of the same design or function are provided with the same reference signs across all figures.

DETAILED DESCRIPTION

The present disclosure relates to a circuit assembly, in particular a circuit assembly for a motor vehicle.

Circuit assemblies are commonly used for the construction of electronic circuits. Here, circuit assemblies commonly have electronic structures or components, such as for example transistors, microprocessors, ASICs and the like. Such circuit assemblies may be used for example in a control device (also referred to as control unit) of an engine and/or transmission of a motor vehicle to perform or permit particular functions of the engine/transmission or of some other component of the motor vehicle.

To protect such circuit assemblies against mechanical and/or chemical influences and/or contamination, the electronic components are commonly arranged in a housing. Since the control devices for engines and/or transmissions are commonly used in the engine compartment or in or on the transmission, and relatively aggressive media, such as for example oil vapors, gases and/or liquids, which can damage the electronic components can be present there, it is of particular importance for the electronic components to be sealed off in media-tight fashion with respect to the surroundings. Furthermore, elevated temperatures often arise in the above-described areas of use, such that, in particular, housings which are intended to seal off the electronic components using classic seal elements, such as for example seal rings or the like, can under some circumstances no longer offer sufficient protection against the aggressive media, for example owing to different thermal expansions. Furthermore, the use of such separate housings for sealing off the electronic components in media-tight fashion requires additional seal elements and a high level of outlay in terms of assembly, which is reflected in an increased price for such control devices.

It is therefore an object of the present disclosure to provide a circuit assembly which is easy to produce and in the case of which electronic components are sealed off in media-tight fashion with respect to surroundings in a particularly straightforward and inexpensive manner.

A circuit assembly according to the disclosure comprises a circuit board, an electronic component which is arranged on the circuit board and which is electrically connected to the circuit board via at least one electrical contact point, and a foamed material sealing element configured to seal off the electronic component and the at least one electronic contact point in media-tight fashion with respect to surroundings of the circuit assembly.

The use of a foamed material sealing element for media-tight coverage provides additional flexibility in relation to, for example, metal covers, and can thus ideally adapt to the spatial conditions of the circuit assembly. Furthermore, less mechanical outlay is required in the production and the assembly of the circuit assembly in relation to a metal cover. It is particularly straightforward and inexpensive if the foamed material sealing element is fastened to the circuit board for example by an adhesive connection.

In one advantageous refinement of the circuit assembly according to the disclosure, the circuit assembly furthermore comprises a cover element which is arranged on the foamed material sealing element and which comprises at least one pressure-exerting portion configured to, when the cover element is pushed against the foamed material sealing element, generate a media-tight contact region between the foamed material sealing element and the circuit board. In this advantageous refinement, the deformability of the foamed material sealing element is utilized to the effect that, when the cover element is pushed against the foamed material sealing element, the cover element deforms said foamed material sealing element such that the media-tight contact region between the foamed material sealing element and the circuit board is generated. In this way, it is not imperatively necessary to use the above-described adhesive connection.

In one particularly preferred refinement, the foamed material sealing element comprises a first region with a first thickness and a second region with a second thickness which is greater than the first thickness. In this particularly preferred refinement, it is furthermore the case that the second region is arranged such that, when the cover element is pushed against the foamed material sealing element the second region is compressed. This particularly preferred refinement is based on the concept that the second region, the thickness of which is greater than the thickness of the first region, is compressed to a greater degree as the cover element is pushed against the foamed material sealing element, and thus the media-tight contact region is formed in a particularly effective manner.

In a further refinement, the at least one pressure-exerting portion is formed as a projection which extends in the direction of the foamed material sealing element. This constitutes a particularly simple refinement of the pressure-exerting portion and may, for example, during the production of the cover element, be formed jointly therewith in an integral manner. Furthermore, the outlay in terms of assembly is reduced, because no separate element, or no separate additional component, must be used for the pressure-exerting portion on the cover element.

The projection is particularly preferably a ring-shaped projection configured to, when the cover element is pushed against the foamed material sealing element, generate a ring-shaped media-tight contact region. By means of the projection of ring-shaped form, it is possible, when the cover element is pushed against the foamed material sealing element, for a uniform pressing force to be exerted in particular on the second region of the foamed material sealing element, whereby the media leak-tightness of the contact region is improved.

In a further refinement, the circuit assembly also comprises a fixing element which fixes the cover element, the foamed material sealing element and the circuit board with a spacing to one another, and in particular with a spacing to one another in a joining or an assembly direction of the circuit assembly. The fixing element may for example be a clamp which fixes the cover element, the foamed material sealing element and the circuit board with the spacing thereof to one another. Other expedient fixing elements are self-evidently conceivable. For example, the circuit board may thus already have projections which, during mounting of the cover element, project through corresponding openings of the cover element and, after the mounting of the cover element, generate the fixing for example by hot caulking. Numerous other expedient refinements of the fixing element are conceivable.

Reference is made firstly to FIG. 1, which is a schematic view of an exemplary embodiment of a circuit assembly 10. The circuit assembly 10 may for example be a circuit assembly for a motor vehicle.

The circuit assembly comprises a circuit board 12 and an electronic component 14, which is supported/held by the circuit board 12 or is arranged thereon. For this purpose, the circuit board 12 comprises a carrier structure. The electronic component 14 furthermore comprises at least one electrical contact point 16 which serves for the electrical connection of the electronic component 14 to the circuit board 12. In the specific example of FIG. 1, 2 electrical contact points are illustrated. It is possible for the electronic component 14 to have some other number of electrical contact points 16. To ensure the electrical application of the electronic component 14 to the circuit board 12, the circuit board 12 comprises electrically conductive conductor tracks.

As seen in FIG. 1, the circuit assembly 10 further comprises a foamed material sealing element 18, which is arranged above or on the electronic component 14. The foamed material sealing element 18 is configured to seal off the electronic component 14 together with the electrical contact points 16 in media-tight fashion with respect to surroundings U of the circuit assembly 10. The media-tight sealing may be realized for example by virtue of the foamed material sealing element 18 having a media-tight adhesive connection in the region of a contact zone 20 between the foamed material sealing element 18 and the circuit board 12. Other expedient refinements for the media-tight sealing of the contact points 16 and of the electronic component 14 are conceivable.

As can also be seen in FIG. 1, the foamed material sealing element 18 comprises a first region 22 with a first thickness 24, and a second region 26, with a second thickness 28. As can be seen in FIG. 1, the second thickness 28 is greater than the first thickness 24, which is advantageous in particular in the embodiments of the circuit assembly 10 described in conjunction with FIG. 2.

Figure 2:
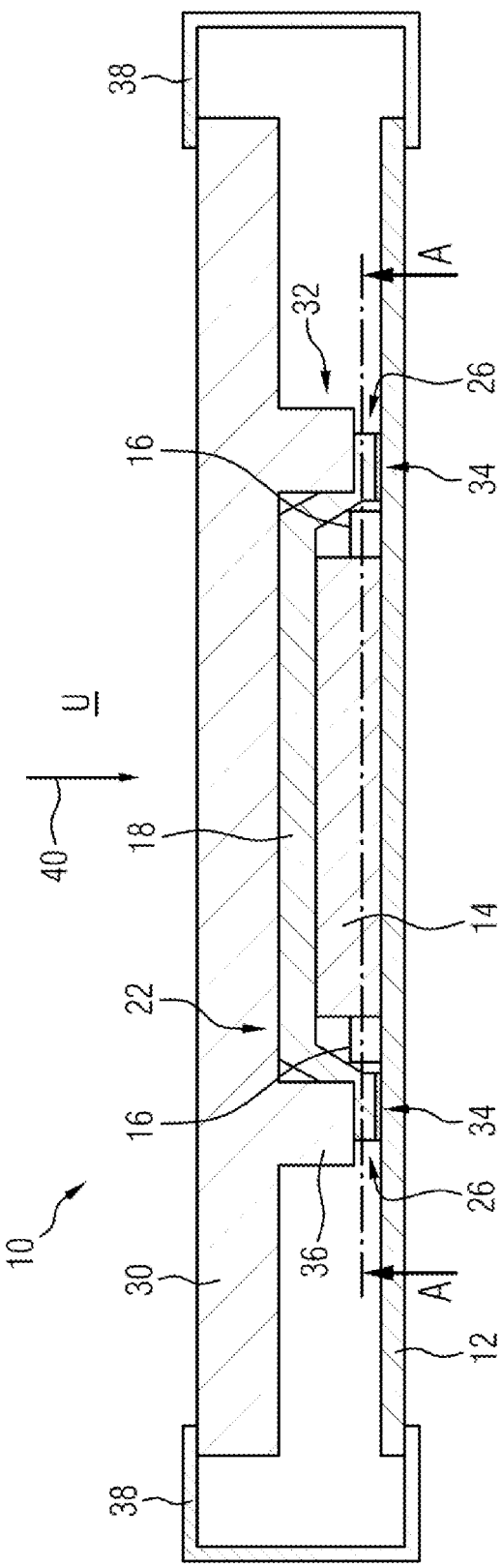
FIG. 2 is a schematic view of a further exemplary embodiment of a circuit assembly.

Reference is now made to FIG. 2, which shows a schematic view of a second refinement of the circuit assembly 10. Like the circuit assembly 10 of FIG. 1, the circuit assembly 10 of FIG. 2 also comprises the circuit board 12, the electronic component 14 with the electrical contact points 16, and the foamed material sealing element 18 arranged on the electronic component 14.

The circuit assembly 10 of FIG. 2 may be further distinguished by the foamed material sealing element 18 comprising an additional cover element 30 which is mounted onto the foamed material sealing element 18 or which is arranged above the foamed material sealing element 28. The cover element 30 comprises a pressure-exerting portion 32 which, when the cover element 30 is pressed or pushed onto the foamed material sealing element 18, deforms or compresses in the second region 26 such that, when the cover element 30 is pushed against the foamed material sealing element 18, a media-tight contact region 34 between the circuit board 12 and the foamed material sealing element 18 is generated. The media-tight contact region 34 may, though need not, have an adhesive connection as described in conjunction in FIG. 1.

In the specific example of FIG. 1, the pressure-exerting portion 32 is furthermore formed as a ring-shaped projection 36, whereby, when the cover element 30 is pressed in against the foamed material sealing element 18, a ring-shaped pressure force is exerted on in particular the second region 26 of the foamed material sealing element 18. This ring-shaped pressure force generates a ring-shaped media-tight contact region 34, which is distinguished by substantially homogeneous and uniform leak-tightness. Because the second region 26 of the foamed material sealing element 18 is of a greater thickness than the first region 22 and, when the cover element 30 is pushed against the foamed material sealing element 18, the second region 26 is compressed, an increase of the pressure force is generated in the region of the contact region 34, whereby the leak-tightness of the contact region 34 is further improved.

As is also schematically indicated in FIG. 2, the circuit assembly 10 furthermore comprises two fixing elements 38 configured to fix the components cover element 30, foamed material sealing element 18 and circuit board 12 with a spacing to one another. The fixing is performed in the direction of a joining direction 40 in which the circuit assembly 10 is joined together or assembled. Merely by way of example, the fixing elements 38 are formed as clamps in the specific example of FIG. 2. Other expedient refinements of the fixing elements 38 are conceivable.

Reference is finally also made to FIG. 3, which shows a schematic sectional view of the circuit assembly 10 of FIG. 2 along the section line A-A. For a better overview, the electrical contact points 16 are not shown in the sectional view of FIG. 3. As can be clearly seen in particular in FIG. 3, the pressure-exerting portion 32 formed as a ring-shaped projection 36 generates a ring-shaped media-tight contact region 34, which is distinguished by the particularly high degree of leak-tightness already described.

With the aid of the circuit assembly 10 according to the disclosure, straightforward and inexpensive media-tight sealing of electronic components together with the electrical contact points thereof is created, which prevents subsequently applied/acting dirt particles or contaminants from generating a short circuit in the circuit assembly 10. This proposed straightforward media-tight sealing leads to a cost reduction in the production, packaging and transport of such circuit assemblies, because retroactive cleaning of the circuit assembly, in particular of the electronic components, is no longer required. It is furthermore ensured that the electronic components, which ultimately constitute an electrical circuit, can no longer be readily manipulated or modified, because the foamed material sealing element is situated, as it were, as a means for protection against manipulation on the electronic components.

The invention claimed is:

1. A circuit assembly comprising:
   a circuit board,
   an electronic component arranged on the circuit board and electrically connected to the circuit board via at least one electrical contact point, and
   a foamed material sealing element which seals off the electronic component and the at least one electrical contact point in media-tight fashion with respect to surroundings by the foamed material sealing element covering the electronic component and the at least one electrical contact point completely with respect to the surroundings,
   a cover element which is arranged on the foamed material sealing element and the cover element comprising at least one pressure-exerting portion configured to, when the cover element is pushed against the foamed material sealing element, generate a media-tight contact region between the foamed material sealing element and the circuit board, and a fixing element which fixes the cover element, the foamed material sealing element and the circuit board with a spacing to one another, wherein the foamed material sealing element comprises a first region with a first thickness and a second region with a second thickness greater than the first thickness, the second region being arranged such that, when the cover element is pushed against the foamed material sealing element, substantially the second region is compressed.

2. The circuit assembly as claimed in claim 1, wherein the at least one pressure-exerting portion is formed as a projection which extends in a direction of the foamed material sealing element.

3. The circuit assembly as claimed in claim 2, wherein the projection is a ring-shaped projection configured to, when the cover element is pushed against the foamed material sealing element, generate a ring-shaped media-tight contact region.

4. The circuit assembly as claimed in claim 1, wherein the first region of the foamed material sealing element is on the electronic component and the second region is surrounding the electronic component and the at least one electrical contact point.

* * * * *